(12) United States Patent
Hou et al.

(10) Patent No.: US 9,739,833 B2
(45) Date of Patent: Aug. 22, 2017

(54) SCAN CHAIN FOR MEMORY SEQUENTIAL TEST

(71) Applicant: International Business Machines Corporation, Armonk, NY (US)

(72) Inventors: Jixiang Hou, Beijing (CN); Hailong Li, Beijing (CN); Li Min Liu, Beijing (CN); Yin Peng Lu, Shanghai (CN); Liudi Wang, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 14/874,502

(22) Filed: Oct. 5, 2015

(65) Prior Publication Data
US 2016/0125957 A1    May 5, 2016

(30) Foreign Application Priority Data
Oct. 30, 2014  (CN) ........................ 2014 1 0599243

(51) Int. Cl.
*G01R 31/28*    (2006.01)
*G01R 31/3177*  (2006.01)
*G11C 29/32*    (2006.01)

(52) U.S. Cl.
CPC .......... *G01R 31/3177* (2013.01); *G11C 29/32* (2013.01); *G11C 2029/3202* (2013.01)

(58) Field of Classification Search
CPC ........ G01R 31/3177; G01R 31/318547; G01R 31/318563; G11C 29/32; G11C 2029/3202; G11C 29/1201; G11C 29/48; G11C 2029/0401; G11C 2029/0405; G11C 29/16; G06F 17/5045
See application file for complete search history.

(56) References Cited

U.S. PATENT DOCUMENTS

| | | | |
|---|---|---|---|
| 5,592,493 A * | 1/1997 | Crouch .......... | G01R 31/318536 324/73.1 |
| 7,194,670 B2 | 3/2007 | Fales et al. | |
| 7,287,203 B1 | 10/2007 | Janson | |
| 7,313,739 B2 * | 12/2007 | Menon .......... | G01R 31/318508 365/201 |
| 7,490,279 B1 | 2/2009 | Kumar et al. | |
| 7,757,133 B1 | 7/2010 | Parulkar | |

(Continued)

OTHER PUBLICATIONS

Devanathan et al., "Techniques to Improve Memory Interface Test Quality for Complex SoCs" International Test Conference, 2011 IEEE, pp. 1-10.

(Continued)

*Primary Examiner* — Guerrier Merant
(74) *Attorney, Agent, or Firm* — L. Jeffrey Kelly

(57) ABSTRACT

A method for constructing a scan chain for a memory sequential test, including determining an input boundary register of the memory; determining a number N of test vectors required according to the type of the memory input pins to which the input boundary register is connected; arranging the scan chain based on the number N, such that in the scan chain, upstream of the input boundary register and immediately adjacent to the input boundary register, there are at least (N−1) continuous non-boundary registers; and setting control signals of the input boundary register and the (N−1) non-boundary registers to make them receive scan test input as test vectors under memory sequential test mode.

19 Claims, 11 Drawing Sheets

(56) References Cited

U.S. PATENT DOCUMENTS

| | | | |
|---|---|---|---|
| 7,831,871 B2* | 11/2010 | Ross .................. | G11C 29/1201 365/200 |
| 8,145,958 B2 | 3/2012 | Aitken et al. | |
| 2002/0194558 A1* | 12/2002 | Wang ............. | G01R 31/318547 714/718 |
| 2007/0011521 A1* | 1/2007 | Dubey ........... | G01R 31/318533 714/724 |
| 2007/0250744 A1* | 10/2007 | Nguyen ................. | G11C 29/02 714/718 |
| 2007/0266278 A1* | 11/2007 | Nadeau-Dostie ...... | G11C 29/50 714/719 |
| 2010/0275076 A1* | 10/2010 | Maehara ........ | G01R 31/318544 714/726 |
| 2013/0275824 A1* | 10/2013 | Tekumalla ..... | G01R 31/318536 714/726 |

OTHER PUBLICATIONS

"A Novel Test Pattern to Detect Marginally Failing Bits in a Weak Column in Dynamic Random Access Memory for Embedded Applications", An IP.com Prior Art Database Technical Disclosure, IP.com No. 000215536, IP.com Electronic Publication: Mar. 6, 2012, pp. 1-5.

Marinissen et al., "Challenges in Embedded Memory Design and Test", Proceedings of the Design, Automation and Test in Europe Conference and Exhibition (DATE'05), IEEE Computer Society, 6 pages.

Powell et al., "BIST for Deep Submicron ASIC Memories with High Performance Application" ITC International Test Conference, Paper 14.2, 2003 IEEE, pp. 386-392.

Mentor Graphics®, "Scan and ATPG Process Guide (DFTAdvisor™, FastScan™ and FlexTest™)", Software Version 8.2008_3, Aug. 2008, 422 pages, Specifically Chapter 4, pp. 104-105.

Zeng et al., "On Correlating Structural Tests with Functional Tests for Speed Binning of High Performance Design", Proceedings of the fifth International Workshop on Microprocessor Test and Verification (MTV'04), IEEE Computer Society, 7 pages.

Pending CN Application No. 201410599243.1, filed on Oct. 30, 2014, entitled: "Scan Chain for Memory Sequential Test, Scan Chain Construction Method and Corresponding Device", 30 pages.

* cited by examiner

SCAN CHAIN FOR MEMORY SEQUENTIAL TEST

BACKGROUND

The present invention generally relates to an integrated circuit (IC) test, and more particularly, to a method and device of constructing a scan chain for a memory sequential test.

During design and production of an IC, a plurality of tests needs to be performed on the IC to ensure correctness of the product. For an IC containing a memory, generally at least the following three types of tests need to be performed thereon, including a logic test, a memory built-in test and a memory interface test.

SUMMARY

According to an embodiment, a method of constructing a scan chain for memory sequential test is provided, comprising: determining an input boundary register of the memory, the input boundary register is a first-level register to which input pins of the memory are connected; determining number N of test vectors required by the input boundary register according to type of the memory input pins to which the input boundary register is connected; arranging the scan chain based on the number N, such that in the scan chain, at upstream of the input boundary register and immediately adjacent to the input boundary register, there are at least (N−1) continuous non-boundary registers; and setting control signals of the input boundary register and the (N−1) non-boundary registers to make them receive scan test input as test vectors under memory sequential test mode.

According to another embodiment, a scan chain for memory sequential test is provided, comprising: an input boundary register, which is a first-level register to which input pins of the memory are connected; there are at least (N−1) continuous non-boundary registers at upstream of the input boundary register and immediately adjacent to the input boundary resister, wherein N is number of test vectors required by the input boundary register; and the input boundary register and the (N−1) non-boundary registers are configured to receive scan test input as test vectors under memory sequential test mode.

According to another embodiment, a device of constructing a scan chain for memory sequential test is provided, comprising: a boundary register determining module configured to determine an input boundary register of the memory, the input boundary register is a first-level register to which input pins of the memory are connected; a vector number determining module configured to determine number N of test vectors required by the input boundary register according to type of the memory input pins to which the input boundary register is connected; a scan chain arranging module configured to arrange the scan chain based on the number N, such that in the scan chain, at upstream of the input boundary register and immediately adjacent to the input boundary register, there are at least (N−1) continuous non-boundary registers; and a control setting module configured to set control signals of the input boundary register and the (N−1) non-boundary registers to make them receive scan test input as test vectors under memory sequential test mode.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

In embodiments of the present invention, sequential test of a memory is improved by re-constructing a scan chain. Specifically, in the process of constructing the scan chain, the number of test vectors required by a boundary register of the memory is considered, such that there is a corresponding number of non-boundary registers upstream of the boundary register. Based on the scan chain constructed as such, when subsequently performing sequential test, the required plurality of test vectors may be directly loaded to the boundary register and its upstream non-boundary registers in one time, thereby reducing influence of combinational logic in regular test paths, simplifying the process of generating and loading test vectors and increasing fault coverage.

Figure 1:
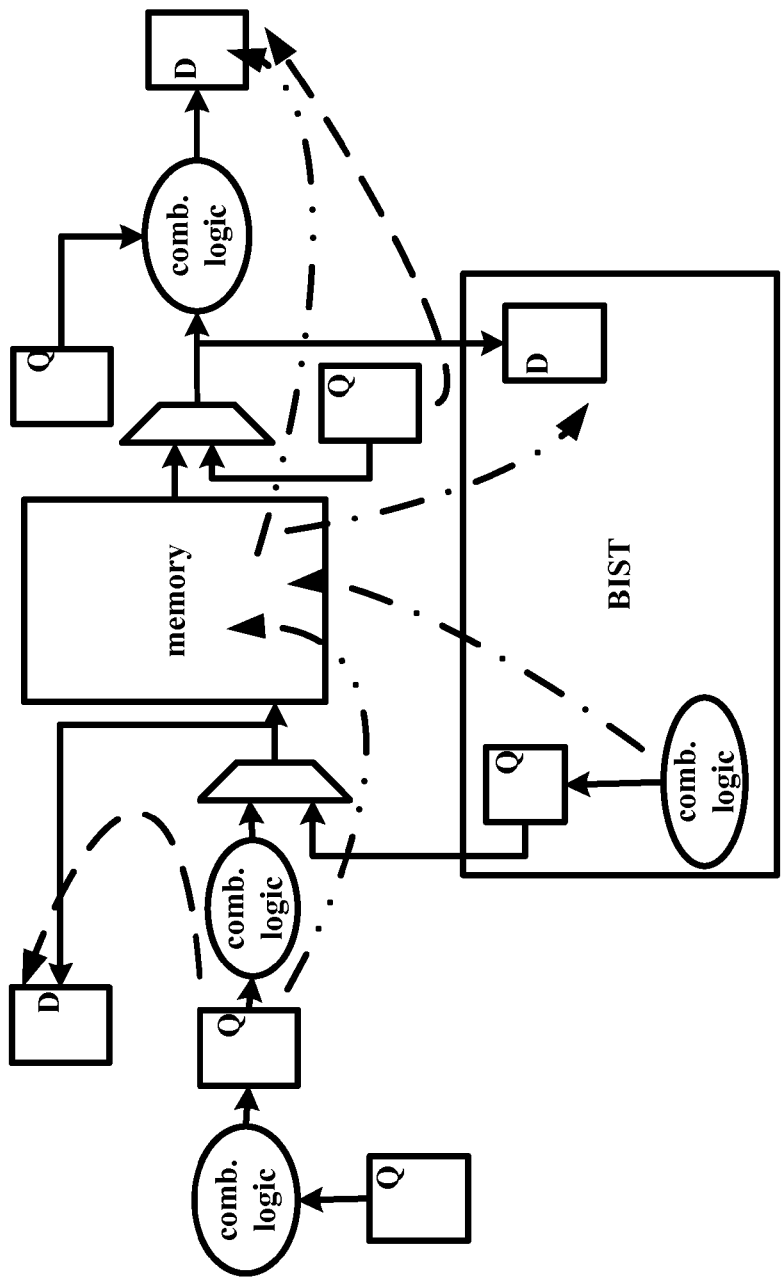
FIG. 1 schematically shows an integrated circuit containing a memory and several related tests.

FIG. 1 schematically shows an IC containing a memory and several related tests. In FIG. 1, the IC includes a memory which is typically formed by a random access memory (RAM) array. In addition to the memory, the IC also includes external logic formed by a variety of circuit design elements, e.g., flip-flop, register, MUX and combinational logic group shown by an ellipse, and the combinational logic group may contain a large number of combinational logic devices. In addition, the IC may also include a BIST test module used for built-in-self-test of the memory. Generally, the BIST test module and the memory external logic are both connected to a multiplex switch and then connected to an input terminal of the memory via selection of the multiplex switch.

In FIG. 1, the dash-line arrow indicates path of logic test. The logic test is mainly to test external fault of the memory (e.g., delay fault or transition fault). Therefore, the test path of the logic test mainly covers various elements external to the memory (external to input terminal and output terminal of the memory), including the register, the flip-flop and the combinational logic group shown in FIG. 1.

The dot-dash-line arrow shows path of the memory built-in test. The memory built-in test is mainly to test internal fault of the memory. Therefore, the corresponding test path is from the BIST test module to internal memory. Under memory built-in test mode, test vectors applied to the memory are generated by the BIST test module.

The double-dot-dash-line arrow shows a memory interface test, also called a memory sequential test. This test is mainly directed to the transition fault at the memory interface (input terminal and output terminal). Therefore, the test path of the memory sequential test is from external logic of the memory to internal memory via the input terminal, and from internal memory to external logic via the output terminal.

It can be seen from FIG. 1 that, in the memory sequential test, test vectors are loaded to the memory via the test path. However, the test path of the memory sequential test usually contains a large number of combinational logic groups (as shown by the ellipse in FIG. 1). These combinational logics make the generation and loading process of test vectors to be more complex. Moreover, fault coverage of the sequential test also depends on complexity of the memory interface and combinational logics. When combinational logics are complex, fault coverage of the test is also relatively low. In addition, the prior art test methods also have deficiency in terms of controllability and observability.

Figure 2:
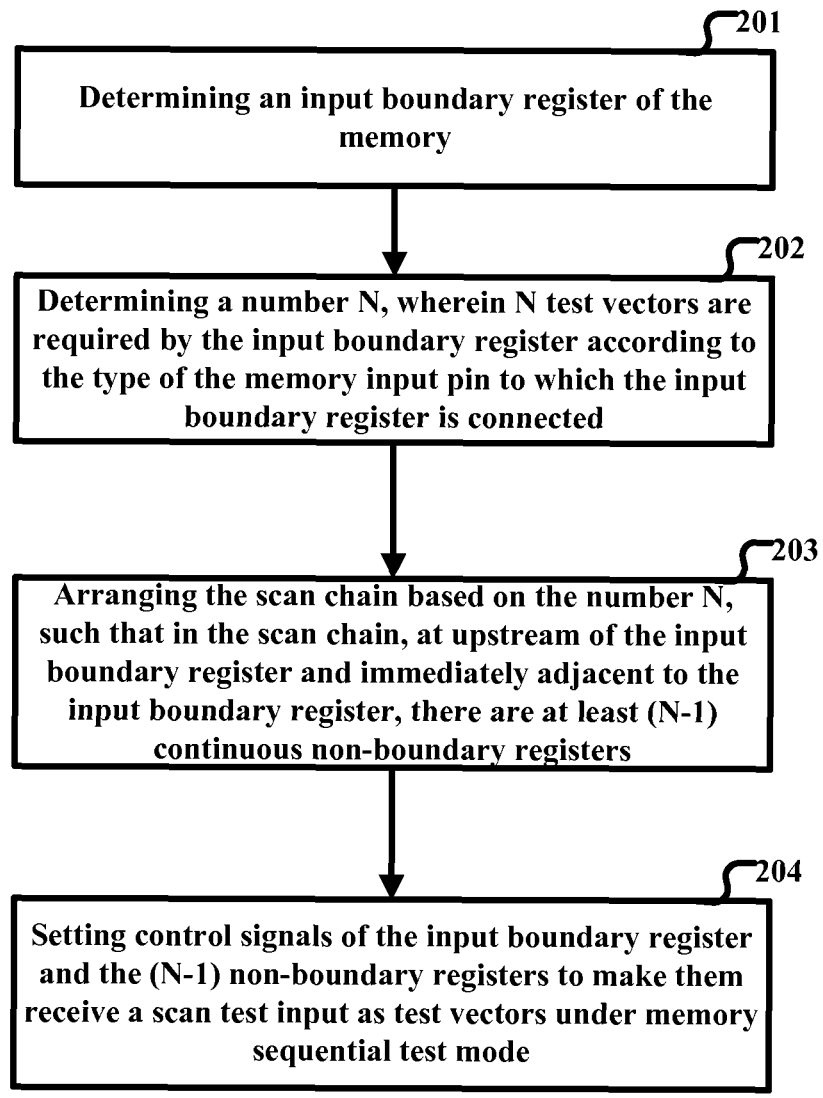
FIG. 2 shows a flowchart of a method of constructing a scan chain according to an embodiment.

According to an embodiment of a first aspect of the present invention, a method of constructing a scan chain for a memory sequential test is provided. FIG. 2 shows a flowchart of a method of constructing a scan chain. As shown in FIG. 2, the method of the embodiment comprises: step 201, determining an input boundary register of the memory, the input boundary register is a first-level register to which input pins of the memory are connected; step 202, determining a number N of test vectors required by the input boundary register according to the type of the memory input pins to which the input boundary register is connected; step 203, arranging the scan chain based on the number N, such that in the scan chain, upstream of the input boundary register and immediately adjacent to the input boundary register, is at least (N−1) continuous non-boundary registers; and step 204, setting control signals of the input boundary register and the (N−1) non-boundary registers to make them receive scan test input as test vectors under memory sequential test mode. Detailed implementations of the above steps will be described below in conjunction with specific examples.

First, at step 201, determining an input boundary register of the memory is described, as appreciated by those skilled in the art. An IC circuit design involves a great number of registers therein. According to whether these registers are directly connected to the memory, they can be divided into boundary registers and non-boundary registers, wherein a boundary register is a first-level register to which pins of the memory are connected, and other registers are non-boundary registers. Furthermore, according to difference in the connected memory pins, the boundary register may be further divided into input a boundary register and an output boundary register, wherein the input boundary register is a first-level register to which input pins of the memory are connected, and is located at an input interface side of the memory; and the output boundary register is a first-level register to which output pins of memory are connected, and is located at an output interface side of the memory. At the above step 201, an input boundary register is determined from the plurality of registers contained in the IC circuit design.

In an embodiment, at step 201, an input boundary register and an output boundary register in a circuit may be determined by analyzing a netlist. As appreciated by those skilled in the art, in electronic design automation, a netlist is usually used to describe information of circuit connection. In a netlist, basic logic gates are used to describe connection status of elements in a circuit. Since the netlist records connection relationship of elements in a circuit, by analyzing the netlist, it can be readily determined to which elements are pins of the memory connected, thus determine the above input boundary register and output boundary register. In other embodiments, those skilled in the art may record connection information in an IC by other means. Regardless which recording means is used, the input boundary register in the circuit can be determined by analyzing the recorded connection information, so as to execute step 201.

Next, at step 202, determining number N of test vectors required by the input boundary register according to the type of the memory input pins to which the input boundary register is connected.

As appreciated by those skilled in the art, a memory has many different types of input pins, including address pins for receiving address input, data pins for receiving data input and control pins for receiving control signal input. For simplicity and convenience in description, the input boundary register connected to the address pins is called A-category register, the input boundary register connected to the data pins is called B-category register, and the input boundary register connected to the control pins is called C-category register.

It is appreciated that, since different types of input boundary registers (A-category, B-category and C-category) are connected to different types of input pins, different types of input signals need to be provided to these input boundary registers. On the other hand, as appreciated by those skilled in the art, test vectors are test excitations or pulses loaded to a test target for checking whether the test target has fault. In order to test different types of input pins, different test vectors need to be loaded to corresponding boundary registers, and in turn to be loaded to the memory. Therefore, number of test vectors required by the input boundary registers depends on the type of input pins to which they are connected. Based on working principle of signals received by different types of input pins, those skilled in the art may known by using a prior art analyzing method that, at least 4 test vectors are needed to test fault of the address pins. That is to say, for A-category register, i.e., the input boundary register connected to the address pin, number N of the required test vectors is 4. Similarly, it is known by analysis that number N of the test vectors required by B-category register is 3; and number N of the test vectors required by C-category register is 4.

Step 203 can be executed after obtaining the above number N, wherein, a scan chain is arranged based on the number N, such that in the scan chain, at upstream of the input boundary register and immediately adjacent to the input boundary register, there are at least (N−1) continuous non-boundary registers.

To describe an arrangement of the above scan chain, first let's review the construction of a scan chain already existed in prior art. As appreciated by those skilled in the art, a scan chain is formed by serially connecting a series of registers in an IC design, and test paths are formed under test mode. Under scan test mode, test vectors are loaded to respective registers of the scan chain.

Figure 3:
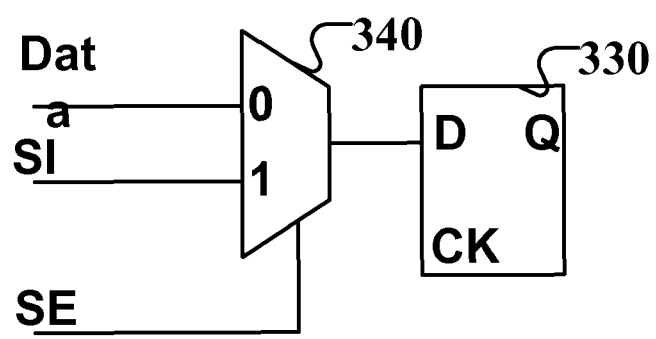
FIG. 3 shows a register unit in a prior art scan chain.

FIG. 3 shows a register unit in a prior art scan chain. As shown in FIG. 3, the register unit includes a register 330 and a MUX 340. Data input of the register 330 is connected to output of the MUX 340. The MUX 340 has two input terminals for receiving data input (Data) and scan test input (SI) respectively, wherein the data input comes from upstream functional logic connected to the register in the IC, and the scan test input comes from output of a pre-stage register of that register in the scan chain. The MUX 340 selects between two inputs under control of a scan enable (SE) signal. In case the scan enable SE signal is 1, that is, when the IC is under scan test mode, the MUX 340 selects the scan input terminal, that is, the scan test signal is input to the register; in case the scan enable SE signal is 0, that is, the IC is in a regular working mode, the MUX 340 selects the data input terminal, that is, regular logic data is input to the register.

Figure 4:
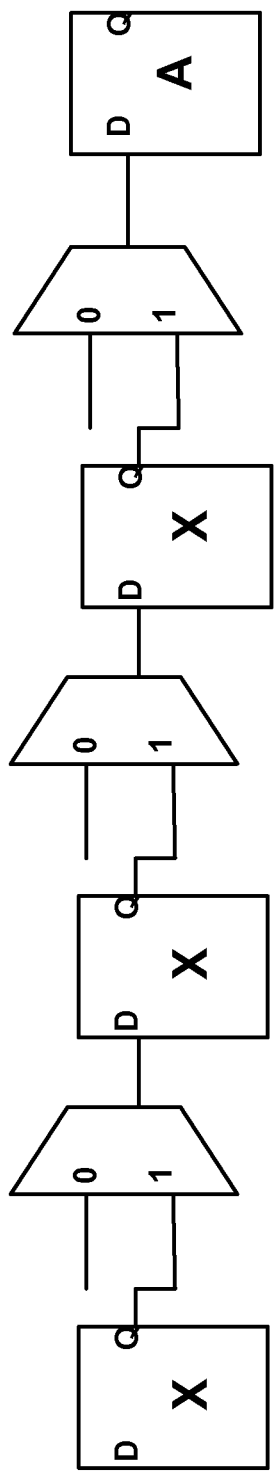
FIG. 4 shows a scan chain segment according to an embodiment.

At step 203, it is desired to arrange N−1 continuous non-boundary registers at upstream of the input boundary register along the scan chain. To this end, based on the register unit structure of FIG. 3 containing a MUX, continuous N−1 non-boundary registers may be formed at upstream of the input boundary register. Specifically, output of each of the first N−2 non-boundary registers in the N−1 non-boundary registers may be connected to a scan input terminal of a MUX corresponding to a next non-boundary register, and output of the last non-boundary register in the N−1 non-boundary registers may be connected to a scan input terminal of a MUX corresponding to the input boundary register. In an embodiment, a scan chain segment as shown in FIG. 4 may be arranged based on the register unit of FIG. 3. FIG. 4 schematically shows an A-category register and upstream registers thereof (in which control signals of respective registers are ignored and will be described later). As described previously, number of test vectors required by A-category register is 4, thus at upstream of the A-category register, 3 non-boundary registers are arranged (for simplicity, here they are shown as X-category registers), and the 3 X-category registers are sequentially connected, and each one connects its output to the scan input terminal of a MUX corresponding to a downstream register. Similarly, corresponding number of non-boundary registers may be arranged at upstream of the B-category register and the C-category register.

It is appreciated that, there are a great number of non-boundary registers in an IC design. In an embodiment, N−1 non-boundary registers in the IC are randomly selected to be arranged at upstream of the input boundary register. On the other hand, for various test needs, an IC usually already has some scan chains which may be designed for different test purposes. In order to "multiplex" existing scan chains, in an embodiment, at step 203, backtracking along existing scan chain by starting from the input boundary register, to determine whether there are continuous N−1 non-boundary registers at its immediately adjacent upstream. If determination result is YES, then the original scan chain is directly used for memory sequential test; if determination result is No, first, determine that number of missing non-boundary registers is L (L<=N−1), then L non-boundary registers are selected from the original scan chain to be connected to upstream of the input boundary register, similar to the connection manner in FIG. 4. Thus, a required scan chain is constructed by reconstructing or rearranging the original scan chain.

In addition to order registers and make connection arrangement, there is also a need to control sequential and working mode of the registers, such that they can work under memory sequential test mode. To this end, step 204 is executed to set control signal of the input boundary register and the above N−1 non-boundary registers, so that they receive scan test input as test vectors under memory sequential test mode.

To realize the above control, in an embodiment, a signal indicating memory sequential test mode, i.e., sequential test mode STM signal, is directly used to control MUX of a register unit in a scan chain. Specifically, in an example, the sequential test mode STM signal is used to replace the original scan enable SE signal shown in FIG. 3 to control the MUX. Thus, when sequential test mode STM signal is 1, that is, under sequential test mode, the MUX selects the scan input terminal, and correspondingly the register receives scan test input; when sequential test mode STM signal is 0, the MUX selects data input terminal, that is, input regular logic data to the register. The above control may be performed on any registers in the input boundary register and the non-boundary registers in the scan chain, such that they receive scan test input as test vectors under memory sequential test mode.

Figure 5:
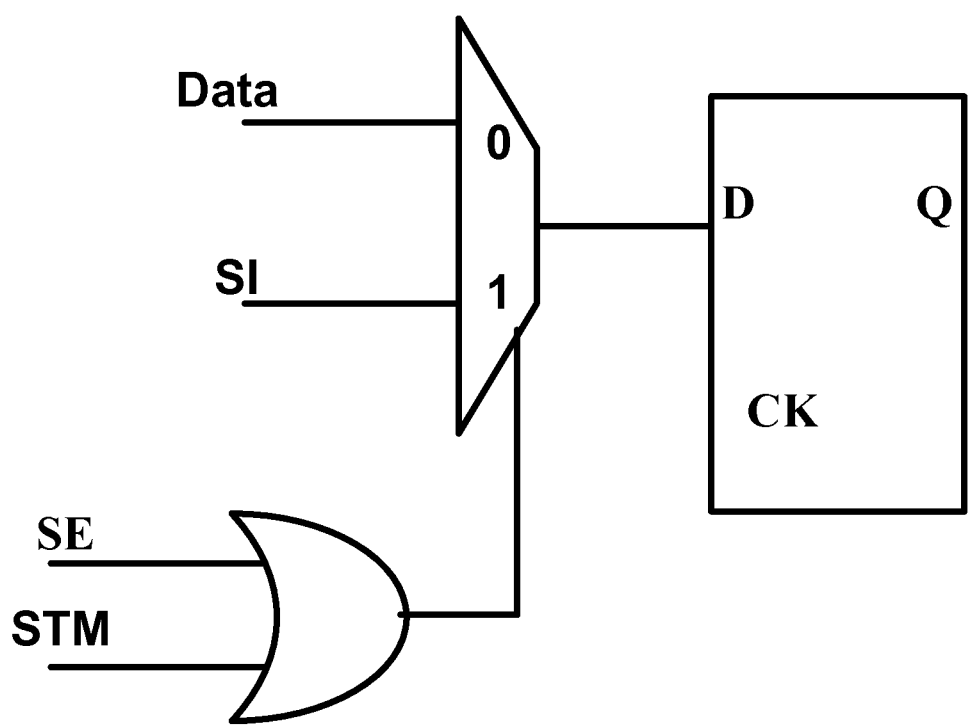
FIG. 5 shows a register unit according to an embodiment.

However, as stated above, in an embodiment, a required scan chain is formed by reconstructing original scan chain. Here, when signal selection control is performed, it is also desired that original scan control will not be affected. To this end, on basis of original scan control signal, a sequential test mode STM signal may be added as control signal. FIG. 5 shows a register unit according to an embodiment. It can be seen by comparing FIGS. 5 and 3 that, compared with the register unit of the original scan chain shown in FIG. 3, the register unit of FIG. 5 adds an OR gate, and uses both original scan enable signal SE and sequential test mode STM signal as input of the OR gate, and uses output of the OR gate as selection control signal of a MUX corresponding to the register. Therefore, when one of the original scan enable signal SE and the sequential test mode STM signal is 1, the register will receive scan test input to enter into test state; and only when both of the original scan signal SE and the sequential test mode STM signal are 0, the register will receive data input and is in regular logic working state. By performing the control shown in FIG. 5 on the input boundary register and the non-boundary register in the constructed scan chain, these registers may be simultaneously used for the test for the original scan chain, and for the memory sequential test for the newly constructed scan chain.

A scan chain for memory sequential test is constructed through the above steps 201 to 204, wherein input boundary register of the memory and its upstream registers are re-arranged, so as to facilitate loading of test vectors. On the other hand, after loading and testing test vectors, test result needs to be read from output side of the memory. Therefore, as another part of the scan chain, the boundary register at output side of the memory should also be adapted to memory sequential test mode, that is, it is set to receive scan test input under memory sequential test mode. Based on this, in order to enhance controllability and observability of the test result, the boundary register at output side may also be further set, to make it latch test result to observe the result. Correspondingly, in an embodiment, the method of constructing a scan chain further comprises the following steps: determining an output boundary register; determining registers outputted to the output boundary registers; setting control signal of the registers outputted to the output boundary register, such that the output boundary register is capable of latching result under memory sequential test mode.

As stated above, the output boundary register is a first-level register to which output pins of the memory are connected, and is at output interface side of the memory. The determination of the output boundary register can be realized by analyzing a netlist or similar files that record IC connection information, which is not described in detail here. After an output boundary register is found, by tracking from input terminal of the output boundary register toward source of signal, at least one register may be found, and output of that register is directly or indirectly connected to input of the output boundary register. It is appreciated that, in case there is a pre-stage register, output terminal of the pre-stage register and output terminal of the memory are connected to a combinational logic, and output of the combinational logic is connected to the output boundary register. The method for signal tracking is a common technical means in the art, which will not be described herein. In the following description, the register outputted to the output boundary register is called as a pre-stage register.

Since the combinational logic will perform operation on output of the pre-stage register and output of the memory, thus the combinational logic output may not be the same as output of the memory. In order to make the output boundary register can latch result under sequential test mode, control signal of the pre-stage register needs to be set, such that when sequential test is performed on the memory, output of the combinational logics and output of the memory are the same, such that the output boundary register can latch output of the memory. In an embodiment, a loop may be formed between output and input of the register, and the loop is controlled by using an additional MUX and a sequential test mode STM signal.

Figure 6:
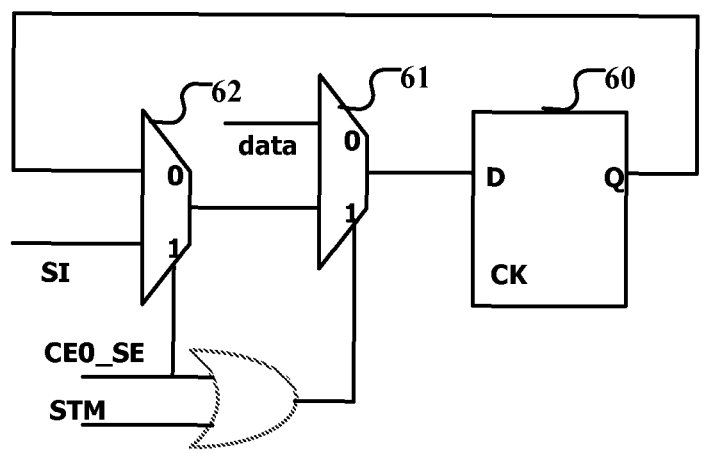
FIG. 6 shows a pre-stage register unit according to an embodiment of the present invention.

FIG. 6 shows a pre-stage register unit according to an embodiment. As shown in FIG. 6, the unit not only comprises the pre-stage register 60, but also comprises two MUXs, i.e., a first MUX 61 and a second MUX 62, and an OR gate. Both of original scan enable signal SE and sequential test mode STM signal are taken as input of the OR gate, and output of the OR gate is taken as a select control signal of the first MUX 61. Moreover, the original scan enable signal SE is taken as a select control signal of the second MUX 62. In addition, output of the pre-stage register and data input of the second MUX 62 are connected to form a loop. By the above arrangement, when the original scan enable signal SE and the sequential test mode STM signal are both 0, that is, under a non-test mode, the pre-stage register 60 works under regular logic state, obtaining data input from the data input terminal of the first MUX. And under the sequential test mode, i.e., the sequential test mode STM signal is 1, if the scan enable SE signal is also 1, scan input terminal of the second MUX is selected as input of the register, that is, the register still receives the scan test input; if the scan enable SE signal is 0, then data input terminal of the second MUX is selected as the register input, and the data input terminal is connected to output of the register; thus, output of the pre-stage register is feedback to the input, and the value remains unchanged, that is, result under the sequential test mode is latched. Based on the example shown in FIG. 6, those skilled in the art can make proper amendments, to latch the test result through a loop from output of the register to input of the register.

Thus, through the above described steps, a scan chain for memory sequential test is constructed. The scan chain is very useful for loading test vector since a specific number of non-boundary registers are arranged at upstream of the input boundary register.

Correspondingly, there is also provided a scan chain constructed by the above method according to an embodiment of a second aspect of the present invention.

In an embodiment, the constructed scan chain has the following structure, that is, it comprises: an input boundary register, which is a first-level register to which input pins of the memory are connected; there are at least (N−1) continuous non-boundary registers at upstream of the input boundary register and immediately adjacent to the input boundary resister, wherein N is number of test vectors required by the input boundary register; and the input boundary register and the (N−1) non-boundary registers are configured to receive scan test input as test vectors under memory sequential test mode.

Specifically, if the input boundary register is the A-category register connected to memory address pins, then number N of the required test vectors is determined as 4; if the input boundary register is the B-category register connected to memory data pins, then number N of the required test vectors is determined as 3; if the input boundary register is the C-category register connected to memory control pins, then number N of the required test vectors is determined as 4.

In an embodiment, in the scan chain, output of each of the first N−2 non-boundary registers in the N−1 non-boundary registers are connected to a scan input terminal of a MUX corresponding to a next non-boundary register, and output of the last non-boundary register in the N−1 non-boundary registers is connected to a scan input terminal of a MUX corresponding to the input boundary register. FIG. 4 shows such a connection structure by taking A-category register for example. In FIG. 4, since number N of test vectors required by the A-category register is 4, at upstream of the A-category register, 3 non-boundary registers (X-category registers) are arranged, which are in turn connected serially, and each one connects its output to a scan input terminal of a MUX corresponding to the downstream register.

In an embodiment, in order to realize signal control of the register, for the input boundary register and the (N−1) non-boundary registers in the scan chain, a signal indicating memory sequential test mode is used directly to control its corresponding MUX.

In another embodiment, an OR gate is added for the above registers, indicating that both of the memory sequential test mode signal and the original scan enable signal of the original scan chain are set as input of the OR gate, and output of the OR gate is set as a select control signal of a MUX corresponding to the above registers. It is appreciated that, an OR gate may be set for the above registers respectively, or an OR gate used by part of or all of the above registers may be set. FIG. 5 shows such an example.

In an embodiment, the scan chain also comprises an output boundary register, the output boundary register is a first-level register to which output pins of the memory are connected; and the output boundary register is set to latch result under the memory sequential test mode.

In an embodiment, if there is another register outputted to the output boundary register, for the output boundary register to be capable of latching test result, a loop is formed between output and input of the register outputted to the output boundary register, and the loop is controlled by an additional MUX and a memory sequential test mode signal. FIG. 6 shows such an example.

What is described above is the constructed scan chain. The scan chain is very useful for loading test vectors since a specific number of non-boundary registers are arranged at upstream of the input boundary register, and thus it is useful for performing memory sequential test.

According to an embodiment of a third aspect of the present invention, there is also provided a method of performing memory sequential test by using the above described scan chain.

Figure 7:
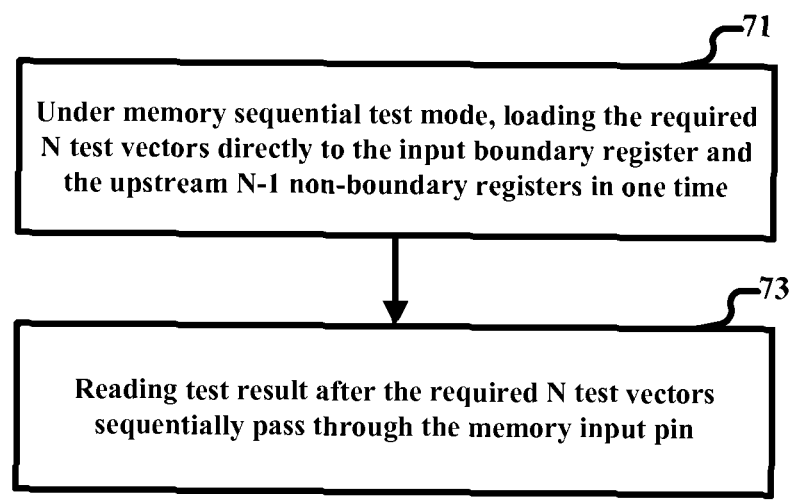
FIG. 7 shows a flowchart of a method of performing memory sequential test by using a scan chain according to an embodiment.

FIG. 7 shows a flowchart of a method of performing memory sequential test by using a scan chain according to an embodiment. As described above, the scan chain comprises an input boundary register, the input boundary register is a first-level register to which input pins of a memory are connected; at upstream of the input boundary register in the scan chain and immediately adjacent to the input boundary register, there are at least (N−1) continuous non-boundary registers, wherein N is number of test vectors required by the input boundary register; moreover, the input boundary register and the N−1 non-boundary registers are set to receive scan test input as test vectors under memory sequential test mode. As shown in FIG. 7, the test method based on the scan chain comprises: step 71, under memory sequential test mode, loading the required N test vectors directly to the input boundary register and the N−1 non-boundary registers in one time; and step 73, reading test result after the required N test vectors sequentially pass through the memory input pins.

As described above, in the scan chain, there are at least N−1 continuous non-boundary registers at upstream of the input boundary register, which provides condition and basis for directly loading N test vectors. That is to say, the upstream N−1 non-boundary registers plus the input boundary register, i.e., the continuous N registers may just be used to load the required N test vectors. Therefore, at step 73, a signal (STM signal in the above) indicating memory sequential test mode may be first set to 1, to put the scan chain under memory sequential test mode. Under this mode, the N required test vectors may be directly loaded to the above N−1 non-boundary registers and the input boundary register in one time.

Figure 8:
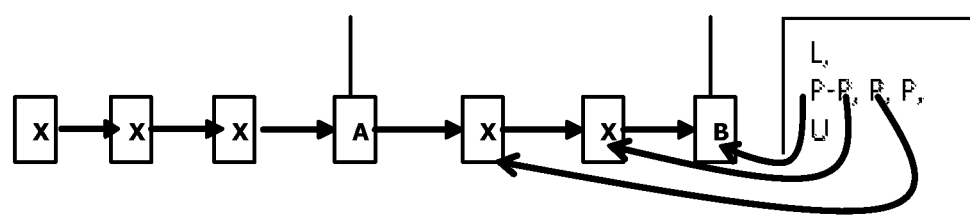
FIG. 8 schematically shows loading of test vectors.

FIG. 8 schematically shows loading of test vectors. As described above, number N of test vectors required by B-category register is 3, and thus in the scan chain segment of FIG. 8, 2 non-boundary registers (shown as X registers) are arranged at upstream of the B-category register. In addition, as shown at right of FIG. 8, L indicates shifting-in or loading of test vectors in the scan chain. Via L, three test vectors required by B-category register will be put into the B-category register and the two X registers at upstream thereof. After the test vectors have been shifted-in, the three test vectors are transmitted to the module to be tested, i.e., the memory, by events (P-P, P), and P-P denotes two continuous short pulses, and P denotes one long pulse. Wherein, the first short pulse transmits the test vectors in the B-category register to the memory, shifts the test vectors in the first X register at upstream of the B-category register to the B-category register, and shifts the test vectors in the second X register at upstream of the B-category register to the first X register at upstream of the B-category register. The function of the second short pulse is similar to that of the long pulse. In this way, the three test vectors are all transmitted to the memory. The bending arrows in FIG. 8 indicate relationship between transmission of the test vectors and the pulses. After all the test vectors are transmitted, another pulse P is used to read the test results, i.e., output of the memory, back to the scan chain. U denotes shifting-out or unloading of the test result from the scan chain.

It is appreciated that, a clock control signal is set on registers to realize synchronization among various registers. Thus, with progressing of the clock, the test vectors loaded at upstream register are sequentially transferred to downstream registers as scan input. Therefore, the B-category register, after obtaining the test vectors via direct loading, obtains subsequent test vectors through transmission from upstream. Further, the B-category register transmits the test vectors to data pins of the memory. Similar operations may be performed for A-category register and the 3 X-category registers at upstream.

In the above process, the required test vectors are directly loaded to the input boundary register and its upstream non-boundary registers in one time, and in turn these test vectors can reach memory pins directly to perform test. This bypasses the combinational logic in the IC, and eliminates dependency on complexity of the combinational logic in the prior art. More specifically, in the prior art, test paths usually involve functional paths between registers and formed by combinational logics. Since influence of these functional paths on the test vectors should be considered, generation and loading of the test vectors will depend on the complexity of these functional paths. When the functional paths are complex, only one test vector can be generated and loaded in one time, and that test vector is unloaded after it passes through the target element, and then a next test vector is re-generated and loaded. However, in the embodiment of the present invention shown in FIG. 8, a plurality of test vectors can be loaded simultaneously, and reach memory input pins sequentially via the input boundary register. This greatly simplifies generation and loading of the test vectors, and improves validity of the test vectors.

After the required N test vectors sequentially passing through the memory input pins, test result may be read at output side of the memory at step 73.

In an embodiment, the scan chain further comprises an output boundary register, the output boundary register is a first-level register to which output pins of the memory are connected; and the output boundary register is set to latch result under the memory sequential test mode. In this case, the latched test result is read via the output boundary register at step 73.

The memory sequential test process is simplified and efficiency is improved through the above method.

Based on the same inventive concept, a device of constructing a scan chain for memory sequential test is provided in an embodiment of a fourth aspect of the present invention.

Figure 9:
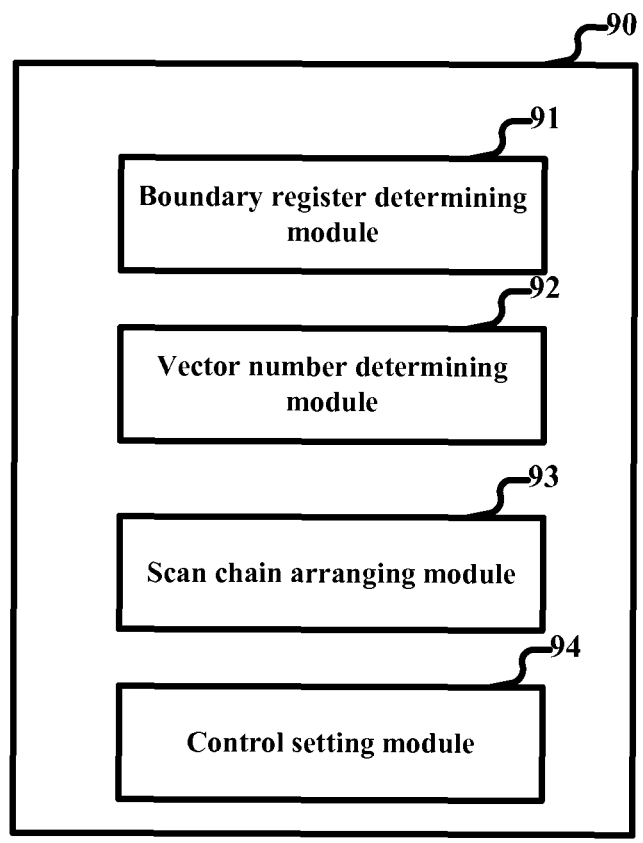
FIG. 9 shows a device for constructing a scan chain according to an embodiment.

FIG. 9 shows a device of constructing a scan chain according to an embodiment. As shown in FIG. 9, the device is generally denoted as 90 and comprises: a boundary register determining module 91 configured to determine an input boundary register of the memory, the input boundary register is a first-level register to which input pins of the memory are connected; a vector number determining module 92 configured to determine number N of test vectors required by the input boundary register according to type of the memory input pins to which the input boundary register is connected; a scan chain arranging module 93 configured to arrange the scan chain based on the number N, such that in the scan chain, at upstream of the input boundary register and immediately adjacent to the input boundary register, there are at least (N−1) continuous non-boundary registers; and a control setting module 94 configured to set control signals of the input boundary register and the (N−1) non-boundary registers to make them receive scan test input as test vectors under memory sequential test mode.

In an embodiment, the vector number determining module 92 is configured to: for the input boundary register connected to address pins of the memory, determine that number N of the required test vectors is 4; for the input boundary register connected to data pins of the memory, determine that number N of the required test vectors is 3; for the input boundary register connected to control pins of the memory, determine that number N of the required test vectors is 4.

In an embodiment, the scan chain arranging module 93 is configured to: connect output of each of the first N−2 non-boundary registers in the N−1 non-boundary registers to a scan input terminal of a MUX corresponding to a next non-boundary register, and connect output of the last non-boundary register in the N−1 non-boundary registers to a scan input terminal of a MUX corresponding to the input boundary register.

In an embodiment, the scan chain arranging module 93 is further configured to: backtrack along original scan chain by starting from the input boundary register, to determine whether there are continuous N−1 non-boundary registers at its immediately adjacent upstream; determine number L of missing non-boundary registers when determination result is NO, and select L non-boundary registers from the original scan chain to be sequentially connected to upstream of the input boundary register.

In an embodiment, the control setting module 94 is configured to: for the input boundary register and the (N−1) non-boundary registers, perform OR operation on both of memory sequential test mode signal and original scan enable signal of the original scan chain, and take result of the OR operation as select control signal of MUXs respectively corresponding to the input boundary register and the (N−1) non-boundary registers.

In an embodiment, the boundary register determining module 91 is further configured to determine an output boundary register, the output boundary register is a first-level register to which output pins of the memory are connected; the control setting module 94 is further configured to set control signal of a register outputted to the output boundary register if there is the register outputted to the output boundary register, such that the output boundary register latches result under the memory sequential test mode.

In an embodiment, the control setting module 94 is further configured to form a loop between output and input of the register outputted to the output boundary register, and control the loop at least by using an additional MUX and a sequential test mode signal.

It is appreciated that, the above device 90 of constructing a scan chain may be embodied as an independent software tool for designing and constructing a scan chain, or may be integrated into existing IC design tools.

According to an embodiment of a fifth aspect of the present invention, there is provided a device for performing memory sequential test by using a scan chain.

Figure 10:
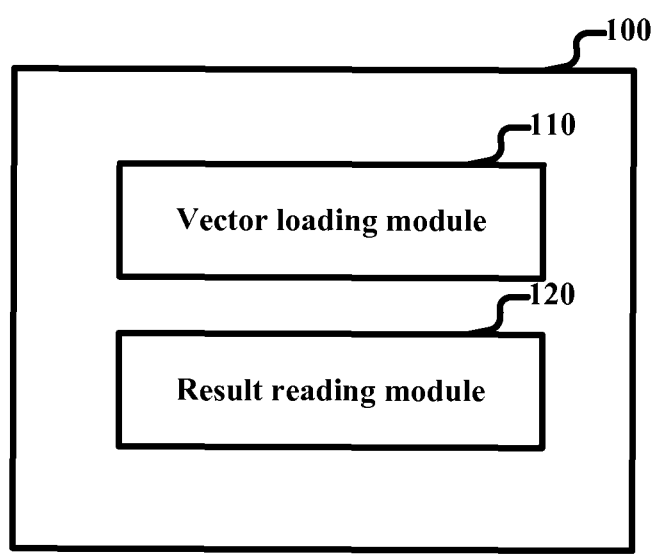
FIG. 10 shows a device for performing sequential test by using a scan chain according to an embodiment.

FIG. 10 shows a device for performing sequential test by using the scan chain according to an embodiment. As working basis of the device, the scan chain comprises an input boundary register, which is a first-level register to which input pins of a memory are connected; in the scan chain, at upstream of the input boundary register and immediately adjacent to the input boundary register, there are at least (N−1) continuous non-boundary registers, wherein N is number of test vectors required by the input boundary register; moreover, the input boundary register and the (N−1) non-boundary registers are set to receive scan test input as test vectors under memory sequential test mode. As shown in FIG. 10, the device for performing sequential test is generally denoted as 100, and comprises: a vector loading module 110 configured to, under memory sequential test mode, directly load the N required test vectors to the input boundary register and the N−1 non-boundary registers in one time; a result reading module 120 configured to read test result after the N required test vectors sequentially passing through the memory input pins.

In an embodiment, the scan chain further comprises an output boundary register, which is a first-level register to which output pins of the memory are connected; and the output boundary register is set to latch result under the memory sequential test mode. Correspondingly, the result reading module 120 is configured to read the latched test result via the output boundary register.

It is appreciated that, the above device 100 for performing sequential test may be embodied as an independent software tool for test, or be integrated into existing IC test tools.

Moreover, the above device 90 of constructing a scan chain and the device 100 for performing memory sequential test may be executed via various manners.

Figure 11:
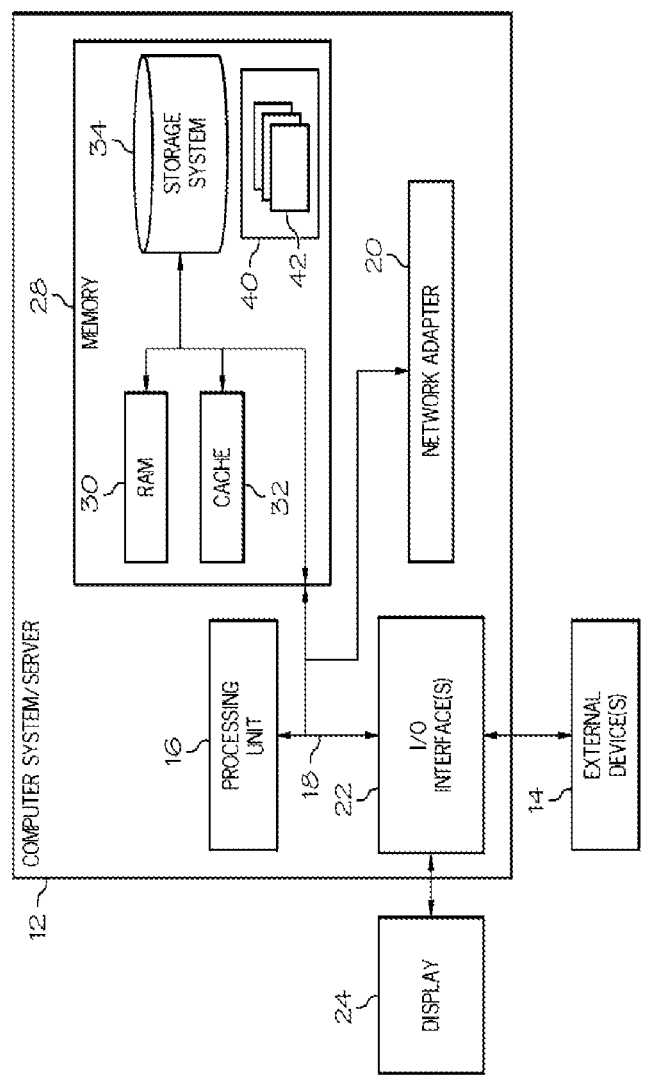
FIG. 11 shows a block diagram of an exemplary computer system/server 12 which is applicable to implement the embodiments of the present invention.

Referring now to FIG. 11, in which a block diagram of an exemplary computer system/server 12 which is applicable to implement the embodiments of the present invention is shown. Computer system/server 12 is only illustrative and is not intended to suggest any limitation as to the scope of use or functionality of embodiments of the invention described herein.

As shown in FIG. 11, computer system/server 12 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of constructing a scan chain for a memory sequential test comprising:
   determining an input boundary register of a memory, the input boundary register is a first-level register to which an input pin of the memory is directly connected;
   determining a number N, wherein N number of test vectors are required by the input boundary register according to a type of the input pin of the memory to which the input boundary register is directly connected;
   arranging the scan chain based on the number N, such that the scan chain comprises at least (N-1) continuous non-boundary registers upstream of and immediately adjacent to the input boundary register; and
   setting control signals of the input boundary register and each of the (N-1) non-boundary registers to receive a scan test input as test vectors under a memory sequential test mode.

2. The method according to claim 1, wherein determining the number N of the test vectors required by the input boundary register comprises:
   determining the number N of the required test vectors is 4 for the input boundary register connected to an address pin of the memory, determining the number N of the required test vectors is 3 for the input boundary register connected to a data pin of the memory, and determining the number N of the required test vectors is 4 for the input boundary register connected to a control pin of the memory.

3. The method according to claim 1, wherein arranging the scan chain comprises:
   connecting outputs of each of a first N-2 non-boundary registers in the N-1 non-boundary registers to a scan input terminal of a MUX corresponding to a next non-boundary register, and connecting output of a last non-boundary register in the N-1 non-boundary registers to a scan input terminal of a MUX corresponding to the input boundary register.

4. The method according to claim 1, wherein arranging the scan comprises:
   backtracking along an original scan chain by starting from the input boundary register to determine whether there are continuous N-1 non-boundary registers at its immediately adjacent upstream, and determining a number L of missing non-boundary registers, in response to a determination of NO, and selecting L non-boundary registers from the original scan chain to be sequentially connected to the upstream of the input boundary register.

5. The method according to claim 1, wherein setting control signals of the input boundary register and the (N-1) non-boundary registers comprises:
   performing OR operation on a memory sequential test mode signal and an original scan enable signal of the original scan chain, and then taking them as select control signals of MUXs respectively corresponding to the input boundary register and the (N-1) non-boundary registers.

6. The method according to claim 1, further comprising:
   determining an output boundary register, the output boundary register is a first-level register to which an output pin of the memory is connected; and
   setting a control signal of another register outputted to the output boundary register, in response to another register output to the output boundary register, the output boundary register latches a result under the memory sequential test mode.

7. The method according to claim 6, wherein setting the control signal of the other register output to the output boundary register comprises:
   forming a loop between output and input of the other register outputted to the output boundary register, and controlling the loop at least by using an additional MUX and a sequential test mode signal.

8. The method according to claim 1, further comprising:
   simultaneously loading N number of test vectors directly to the input boundary register and the (N-1) non-boundary registers, respectively, such that each test vector is sequentially delivered to the input pin of the memory via the input boundary register.

9. The method according to claim 1, further comprising:
   simultaneously loading N number of test vectors directly to the input boundary register and the (N-1) non-boundary registers, respectively, such that each test vector is sequentially delivered to the input pin of the memory via the input boundary register.

10. The method according to claim 9, wherein determining the number N of the test vectors required by the input boundary register comprises:
    determining the number N of the required test vectors is 4 for the input boundary register connected to an address pin of the memory, determining the number N of the required test vectors is 3 for the input boundary register connected to a data pin of the memory, and determining the number N of the required test vectors is 4 for the input boundary register connected to a control pin of the memory.

11. The method according to claim 1, further comprising:
    simultaneously loading N number of test vectors directly to the input boundary register and the (N-1) non-boundary registers, respectively, such that each test vector is sequentially delivered to the input pin of the memory via the input boundary register.

12. A scan chain for a memory sequential test, comprising:
- an input boundary register directly connected an input pin of a memory; and
- at least (N−1) continuous non-boundary registers at upstream of and immediately adjacent to the input boundary register, wherein N is a number of test vectors required by the input boundary register, wherein the input boundary register and the (N−1) non-boundary registers are configured to receive a scan test input as test vectors under memory sequential test mode.

13. The scan chain according to claim 12, wherein outputs of each of a first N−2 non-boundary registers in the N−1 non-boundary registers are connected to a scan input terminal of a MUX corresponding to a next non-boundary register, and output of a last non-boundary register in the N−1 non-boundary registers is connected to a scan input terminal of a MUX corresponding to the input boundary register.

14. The scan chain according to claim 12, wherein a result of OR operation on a memory sequential test mode signal and an original scan enable signal of the original scan chain is taken as select control signals of MUXs respectively corresponding to the input boundary register and the (N−1) non-boundary registers.

15. The scan chain according to claim 12, further comprising:
- an output boundary register, the output boundary register is a first-level register to which an output pin of the memory is connected; and the output boundary register is set to latch result under the memory sequential test mode.

16. The scan chain according to claim 15, further comprising:
- a pre-stage register, wherein an output terminal of the pre-stage register and the output pin of the memory are connected to a combinational logic, and an output of the combinational logic is connected to an input terminal of the output boundary register, and wherein a control signal of the pre-stage register is set such that the output of the combinational logic and the output of the memory are the same when the memory sequential test is performed.

17. A method of constructing a new scan chain for a memory sequential test comprising:
- identifying an input boundary register of a memory from a plurality of registers of an integrated circuit, the input boundary register is a first-level register directly connected to an input pin of the memory;
- determining a number N of test vectors required by the input boundary register according to a type of the input pin of the memory directly connected to the input boundary register;
- forming the new scan chain by rearranging an original scan chain of the integrated circuit based on the number N, such that the new scan chain comprises at least (N−1) continuous non-boundary registers upstream of and immediately adjacent to the input boundary register, wherein the input boundary register and the (N−1) non-boundary registers are simultaneously used for testing of the original scan chain and for the memory sequential test using the new scan chain, and wherein scan control of the original scan chain remains unaffected;
- connecting outputs of each of a first N−2 non-boundary registers in the N−1 non-boundary registers to a scan input terminal of a MUX corresponding to a next non-boundary register, and connecting an output of a last non-boundary register in the N−1 non-boundary registers to a scan input terminal of a MUX corresponding to the input boundary register; and
- using both a memory sequential test mode signal of the new scan chain and an original scan enable signal of the original scan chain as inputs to an OR gate, and using an output of the OR gate as a selection control signal of each MUX corresponding to the input boundary register and the (N−1) non-boundary registers, such that each of the input boundary register and the (N−1) non-boundary registers receives a scan test input when either one of the sequential test mode signal or the original scan enable signal and is 1, and each of the input boundary register and the (N−1) non-boundary registers receives data input only when both the original scan signal and the sequential test mode signal are 0.

18. The method according to claim 17, wherein determining the number N of the test vectors required by the input boundary register comprises:
- determining the number N of the required test vectors is 4 for the input boundary register connected to an address pin of the memory, determining the number N of the required test vectors is 3 for the input boundary register connected to a data pin of the memory, and determining the number N of the required test vectors is 4 for the input boundary register connected to a control pin of the memory.

19. A method of constructing a scan chain for a memory sequential test comprising:
- selecting an input boundary register of a memory from a plurality of registers of an integrate circuit, the input boundary register is a first-level register directly connected to an input pin of the memory;
- determining a number N of test vectors required by the input boundary register according to a type of the input pin of the memory directly connected to the input boundary register;
- randomly selecting (N−1) non-boundary registers from the plurality of registers;
- connecting outputs of each of a first N−2 non-boundary registers in the N−1 non-boundary registers to a scan input terminal of a MUX corresponding to a next non-boundary register, and connecting output of a last non-boundary register in the N−1 non-boundary registers to a scan input terminal of a MUX corresponding to the input boundary register;
- connecting an output of an OR gate to a selection control signal of each MUX corresponding each of the input boundary register and the N−1 non-boundary registers; and connecting both a scan enable signal and a memory sequential test signal to input terminals of each OR gate such that each of the input boundary register and the (N−1) non-boundary registers receives a scan test input when either one of the sequential test mode signal or the original scan enable signal and is 1, and each of the input boundary register and the (N−1) non-boundary registers receives data input only when both the original scan signal and the sequential test mode signal are 0.

* * * * *